United States Patent
Morein et al.

(10) Patent No.: US 10,216,302 B2
(45) Date of Patent: Feb. 26, 2019

(54) ROUTING FOR AN INTEGRATED DISPLAY AND INPUT SENSING DEVICE

(71) Applicant: SYNAPTICS INCORPORATED, San Jose, CA (US)

(72) Inventors: Stephen L. Morein, San Jose, CA (US); Tai-Chien Liu, San Jose, CA (US); Shriram Kulkarni, San Jose, CA (US); Joseph Kurth Reynolds, Alviso, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 322 days.

(21) Appl. No.: 14/805,286

(22) Filed: Jul. 21, 2015

(65) Prior Publication Data
US 2016/0026313 A1  Jan. 28, 2016

Related U.S. Application Data

(60) Provisional application No. 62/100,454, filed on Jan. 6, 2015, provisional application No. 62/027,772, filed on Jul. 22, 2014.

(51) Int. Cl.
*G06F 3/041* (2006.01)
*G06F 3/044* (2006.01)
(Continued)

(52) U.S. Cl.
CPC ............ *G06F 3/0412* (2013.01); *G06F 3/041* (2013.01); *G06F 3/044* (2013.01); *G06F 3/0416* (2013.01);
(Continued)

(58) Field of Classification Search
CPC ...... G06F 3/0412; G06F 3/0416; G06F 3/044; G09G 3/20; G09G 5/006;
(Continued)

(56) References Cited

U.S. PATENT DOCUMENTS 6,266,119 B1 * 7/2001 Takahashi ........... G02F 1/13452
                                                    349/149
6,407,795 B1 * 6/2002 Kamizono .......... G02F 1/13452
                                                    349/149
(Continued)

FOREIGN PATENT DOCUMENTS

EP            2642480 A1     9/2013

OTHER PUBLICATIONS

International Search Report and Written Opinion of the International Searching Authority, PCT/2015/041591, dated Apr. 7, 2016, consists of 12 pages.

(Continued)

*Primary Examiner* — Amare Mengistu
*Assistant Examiner* — Crystal Mathews
(74) *Attorney, Agent, or Firm* — Patterson + Sheridan, LLP

(57) ABSTRACT

Display devices with improved routing between connectors and source drivers disposed on a substrate such as glass. Various features improve different characteristics of the routings between the connectors and source drivers. For example, a t-shaped connector is provided to ensure voltage provided to the source drivers is approximately equal. Routings may be tapered (i.e., altered in width) to reduce the amount of area consumption in locations where doing so is desirable but to decrease resistance in areas having more space. Routings may also include stacked power supply and ground traces to provide benefits such as improved decoupling capacitance. Other features are provided.

20 Claims, 15 Drawing Sheets

(51) Int. Cl.
*H01L 27/15* (2006.01)
*H01L 33/38* (2010.01)
*G09G 3/20* (2006.01)
*G09G 5/00* (2006.01)

(52) U.S. Cl.
CPC .............. *G09G 3/20* (2013.01); *G09G 5/006* (2013.01); *H01L 27/156* (2013.01); *H01L 33/38* (2013.01); *G09G 2300/0408* (2013.01); *G09G 2300/0426* (2013.01); *G09G 2310/0275* (2013.01); *G09G 2320/0209* (2013.01)

(58) Field of Classification Search
CPC ... G09G 2300/0408; G09G 2300/0426; G09G 2310/0275; G09G 2310/0264; G09G 2310/0278; G09G 2320/0209; H01L 27/156; H01L 33/38
See application file for complete search history.

(56) References Cited

U.S. PATENT DOCUMENTS

| | | | | |
|---|---|---|---|---|
| 6,525,718 | B1* | 2/2003 | Murakami | G02F 1/13452 345/103 |
| 6,583,844 | B1* | 6/2003 | Mishima | G02F 1/13452 349/149 |
| 6,977,640 | B1* | 12/2005 | Baek | G09G 3/3611 345/102 |
| 9,053,673 | B2 | 6/2015 | Yuan et al. | |
| 9,070,315 | B2 | 6/2015 | Hong et al. | |
| 9,625,775 | B2* | 4/2017 | Katagiri | G02F 1/13452 |
| 2004/0061694 | A1* | 4/2004 | Noguchi | G09G 3/3233 345/204 |
| 2004/0150781 | A1* | 8/2004 | Lim | G02F 1/136286 349/151 |
| 2005/0184978 | A1 | 8/2005 | Bu et al. | |
| 2005/0189594 | A1 | 9/2005 | Uehara | |
| 2006/0139291 | A1* | 6/2006 | Cho | G09G 3/3688 345/100 |
| 2006/0202936 | A1 | 9/2006 | Chen et al. | |
| 2006/0203138 | A1* | 9/2006 | Chen | G09G 3/3611 349/39 |
| 2006/0232579 | A1* | 10/2006 | Chen | G09G 3/3611 345/211 |
| 2006/0233003 | A1* | 10/2006 | Iwanaga | G09G 3/20 365/1 |
| 2006/0290641 | A1* | 12/2006 | Ku | G09G 3/20 345/98 |
| 2008/0048948 | A1* | 2/2008 | Koh | G09G 3/3208 345/80 |
| 2009/0009462 | A1* | 1/2009 | Hsu | G02F 1/133305 345/99 |
| 2009/0051844 | A1* | 2/2009 | Chen | G09G 3/006 349/54 |
| 2010/0283777 | A1* | 11/2010 | Sang | G09G 3/3696 345/212 |
| 2010/0287317 | A1 | 11/2010 | Shen et al. | |
| 2010/0289839 | A1* | 11/2010 | Min | G09G 3/3648 345/691 |
| 2011/0007257 | A1* | 1/2011 | Min | G02F 1/136286 349/150 |
| 2011/0102687 | A1* | 5/2011 | Ko | G02F 1/1345 348/790 |
| 2011/0164005 | A1 | 7/2011 | Miyata | |
| 2011/0285679 | A1* | 11/2011 | Oh | G02F 1/136277 345/206 |
| 2012/0007527 | A1 | 1/2012 | Miyano | |
| 2012/0113163 | A1* | 5/2012 | Hsu | G02F 1/13452 345/690 |
| 2012/0327617 | A1 | 12/2012 | Maeyama | |
| 2013/0002621 | A1* | 1/2013 | Chen | G09G 3/3685 345/204 |
| 2013/0127813 | A1* | 5/2013 | Lee | G09G 5/006 345/212 |
| 2013/0241859 | A1* | 9/2013 | Saitoh | G06F 3/041 345/173 |
| 2013/0321296 | A1* | 12/2013 | Lee | G06F 3/041 345/173 |
| 2014/0008203 | A1 | 1/2014 | Nathan et al. | |
| 2014/0139413 | A1* | 5/2014 | Kwon | G09G 3/3208 345/82 |
| 2014/0139771 | A1* | 5/2014 | Choi | H01L 51/52 349/43 |
| 2014/0239317 | A1* | 8/2014 | Bang | H05K 1/147 257/88 |
| 2014/0354606 | A1* | 12/2014 | Chen | G09G 5/18 345/204 |
| 2015/0138474 | A1* | 5/2015 | Chang | G02F 1/133 349/43 |
| 2015/0243254 | A1* | 8/2015 | Choi | G09G 5/18 345/212 |

OTHER PUBLICATIONS

International Preliminary Report on Patentability, PCT/2015/041591, dated Feb. 2, 2017, consists of 9 pages.

* cited by examiner

ROUTING FOR AN INTEGRATED DISPLAY AND INPUT SENSING DEVICE

CROSS-REFERENCE TO RELATED APPLICATIONS

This application claims benefit of U.S. provisional patent application Ser. No. 62/027,772, filed Jul. 22, 2014, and U.S. provisional patent application Ser. No. 62/100,454, filed Jan. 6, 2015 which is incorporated by reference herein.

BACKGROUND

Field of the Disclosure

Embodiments generally relate to display devices and, in particular, to routing configurations for connectors coupled to source drivers in display devices.

Description of the Related Art

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones).

Some proximity sensor devices include display elements. Both touch elements and display elements may be provided with signals and power via one or more source drivers. The source drivers may be located on a substrate, such as glass, and may interface with off-glass chips via a flexible connector that attaches to the substrate. Flexible connectors are coupled to source drivers via on-substrate routings. Various characteristics of these routings may affect display and touch performance.

SUMMARY

A display assembly is provided. The display assembly includes a plurality of display elements disposed on a substrate. The display assembly also includes a plurality of source driver lines disposed on the substrate and coupled to the plurality of display elements. The display assembly further includes a plurality of source drivers disposed on the substrate and coupled to the plurality of source driver lines, the plurality of source drivers configured to drive the plurality of source driver lines to drive the plurality of display elements for display updating. The display assembly also includes a plurality of connectors extending out of the substrate and providing display signals and power supply signals to the plurality of source drivers via a plurality of routings. A ratio of a number of connectors in the plurality of connectors to a number of source drivers in the plurality of source drivers is a ratio other than one-to-one or one-to-two.

Another display assembly is also provided. The display assembly includes a plurality of display element disposed on a substrate. The display assembly also includes a plurality of source driver lines disposed on the substrate and coupled to the plurality of display elements. The display assembly further includes a plurality of source drivers disposed on the substrate and coupled to the plurality of source driver lines, the plurality of source drivers configured to drive the plurality of source driver lines to drive the plurality of display elements for display elements. The display assembly also includes a first connector of a plurality of connectors configured to provide power supply signals and display signals to a first source driver of the plurality of source drivers and a second source driver of the plurality of source drivers. The display assembly further includes a second connector of the plurality of connectors configured to provide power supply signals and display signals to the second source driver and a third source driver of the plurality of source drivers.

An input device is provided. The input device includes a plurality of sensor electrodes. The input device also includes a plurality of display elements disposed on a substrate. The input device further includes a plurality of source driver lines disposed on the substrate and coupled to the plurality of display elements. The input device also includes a plurality of source drivers disposed on the substrate, the plurality of source drivers coupled to the plurality of source driver lines and to the plurality of sensor electrodes, the plurality of source drivers configured to drive the plurality of source driver lines to drive the plurality of display elements for display updating and to drive the plurality of sensor electrodes for capacitive sensing. The input device further includes a plurality of connectors extending out of the substrate and providing display signals, sensing signals, and power supply signals to the plurality of source drivers via a plurality of routings. A ratio of a number of connectors in the plurality of connectors to a number of source drivers in the plurality of source drivers is a ratio other than one-to-one or one-to-two.

BRIEF DESCRIPTION OF THE DRAWINGS

So that the manner in which the above recited features of embodiments can be understood in detail, a more particular description of embodiments, briefly summarized above, may be had by reference to embodiments, some of which are illustrated in the appended drawings. It is to be noted, however, that the appended drawings illustrate only typical embodiments and are therefore not to be considered limiting of scope, for other effective embodiments may be admitted.

To facilitate understanding, identical reference numerals have been used, where possible, to designate identical elements that are common to the figures. It is contemplated that elements of one embodiment may be beneficially incorporated in other embodiments.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Various embodiments of the present invention provide display devices with improved routing between connectors and source drivers disposed on a substrate such as glass. Various features improve different characteristics of the routings between the connectors and source drivers. For example, a t-shaped connector is provided to ensure voltage provided to the source drivers is approximately equal. Routings may be tapered (i.e., altered in width) to reduce the amount of area consumption in locations where doing so is desirable but to decrease resistance in areas having more space. Routings may also include stacked power supply and ground traces to provide benefits such as improved decoupling capacitance. Other features and characteristics are provided below.

Figure 1A:
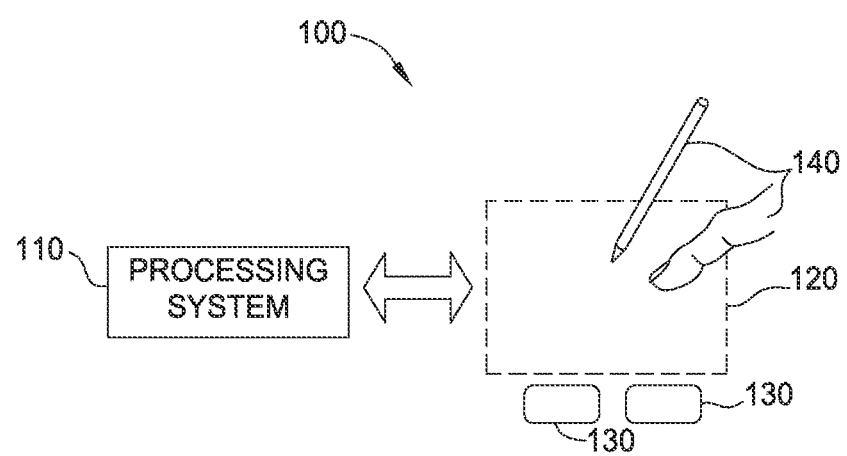
FIG. 1A is a block diagram of an exemplary input device, in accordance with embodiments of the invention.

Turning now to the figures, FIG. 1A is a block diagram of an exemplary input device 100, in accordance with embodiments of the invention. The input device 100 may be configured to provide input to an electronic system (not shown). As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system, or can be physically separate from the electronic system. As appropriate, the input device 100 may communicate with parts of the electronic system using any one or more of the following: buses, networks, and other wired or wireless interconnections. Examples include $I^2C$, SPI, PS/2, Universal Serial Bus (USB), Bluetooth, RF, and IRDA.

In FIG. 1A, the input device 100 is shown as a proximity sensor device (also often referred to as a "touchpad" or a "touch sensor device") configured to sense input provided by one or more input objects 140 in a sensing region 120. Example input objects include fingers and styli, as shown in FIG. 1A.

Sensing region 120 encompasses any space above, around, in and/or near the input device 100 in which the input device 100 is able to detect user input (e.g., user input provided by one or more input objects 140). The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device 100, contact with an input surface (e.g. a touch surface) of the input device 100, contact with an input surface of the input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region 120 has a rectangular shape when projected onto an input surface of the input device 100.

The input device 100 may utilize any combination of sensor components and sensing technologies to detect user input in the sensing region 120. The input device 100 comprises one or more sensing elements for detecting user input. As several non-limiting examples, the input device 100 may use capacitive, elastive, resistive, inductive, magnetic, acoustic, ultrasonic, and/or optical techniques.

Some implementations are configured to provide images that span one, two, three, or higher dimensional spaces. Some implementations are configured to provide projections of input along particular axes or planes. Further, some implementations may be configured to provide a combination of one or more images and one or more projections.

In some resistive implementations of the input device 100, a flexible and conductive first layer is separated by one or more spacer elements from a conductive second layer. During operation, one or more voltage gradients are created across the layers. Pressing the flexible first layer may deflect it sufficiently to create electrical contact between the layers, resulting in voltage outputs reflective of the point(s) of contact between the layers. These voltage outputs may be used to determine positional information.

In some inductive implementations of the input device 100, one or more sensing elements pick up loop currents induced by a resonating coil or pair of coils. Some combination of the magnitude, phase, and frequency of the currents may then be used to determine positional information.

In some capacitive implementations of the input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage, and by detecting the capacitive coupling between the sensor electrodes and input objects. The reference voltage may by a substantially constant voltage or a varying voltage. In various embodiments, the reference voltage may be system ground.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes") and one or more receiver sensor electrodes (also "receiver electrodes"). Transmitter sensor electrodes may be modulated relative to the receiver sensor electrodes. For example, the transmitter sensor electrodes may be modulated relative to a reference voltage to transmit transmitter signals and the receiver sensor electrodes may be held substantially constant relative to the reference voltage to facilitate receipt of resulting signals. The reference voltage may by a substantially constant voltage or a varying voltage. In various embodiments, the reference voltage may be system ground. A resulting signal may comprise effect(s) corresponding to one or more transmitter signals, and/or to one or more sources of environmental interference (e.g. other electromagnetic signals). Sensor electrodes may be dedicated transmitters or receivers, or may be configured to both transmit and receive.

In FIG. 1A, a processing system 110 is shown as part of the input device 100. The processing system 110 is configured to operate the hardware of the input device 100 to detect input in the sensing region 120. The processing system 110 comprises parts of or all of one or more integrated circuits (ICs) and/or other circuitry components. For example, a processing system for a mutual capacitance sensor device may comprise transmitter circuitry configured to transmit signals with transmitter sensor electrodes, and/or receiver circuitry configured to receive signals with receiver sensor electrodes). In some embodiments, the processing system 110 also comprises electronically-readable instructions, such as firmware code, software code, and/or the like. In some embodiments, components composing the processing system 110 are located together, such as near sensing element(s) of the input device 100. In other embodiments, components of processing system 110 are physically separate with one or more components close to sensing element(s) of input device 100, and one or more components elsewhere. For example, the input device 100 may be a peripheral coupled to a computing device, and the processing system 110 may comprise software configured to run on a central processing unit of the computing device and one or more ICs (perhaps with associated firmware) separate from the central processing unit. As another example, the input device 100 may be physically integrated in a mobile device, and the processing system 110 may comprise circuits and firmware that are part of a main processor of the mobile device. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes. In one or more embodiments, a first and second module may be comprised in separate integrated circuits. For example, a first module may be comprised within a first integrated circuit and a separate module may be comprised within a second integrated circuit. Further, portions of a single module may span multiple integrated circuits.

In some embodiments, the processing system 110 responds to user input (or lack of user input) in the sensing region 120 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system (e.g. to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions.

For example, in some embodiments, the processing system 110 operates the sensing element(s) of the input device 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning.

As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120, or some other functionality. FIG. 1A shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 120 overlaps at least part of an active area of a display screen. For example, the input device 100 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display screen may share physical elements. For example, some embodiments may utilize some of the same electrical components for displaying and sensing. As another example, the display screen may be operated in part or in total by the processing system 110.

In various embodiments, the input device 100 may comprise one or more sensor electrodes configured for both display updating and input sensing. For example, at least one sensor electrodes that are used for input sensing may comprise one or more display electrodes of the display device that are used in updating the display. Further, the display electrode may comprise one or more of segments of a Vcom electrode (common electrodes), source drive lines (electrodes), gate line (electrodes), an anode sub-pixel electrode or cathode pixel electrode, or any other display element. These display electrodes may be disposed on an appropriate display screen substrate. For example, the display electrodes may be disposed on a transparent substrate (a glass substrate, TFT glass, or any other transparent material) in some display screens (e.g., In Plane Switching (IPS), Fringe Field Switching (FFS) or Plane to Line Switching (PLS) Organic Light Emitting Diode (OLED)), on the bottom of the color filter glass of some display screens (e.g., Patterned Vertical Alignment (PVA) Multi-domain Vertical Alignment (MVA), IPS and FFS), over an cathode layer (OLED), etc. In such embodiments, the display electrode can also be referred to as a "combination electrode", since it performs multiple functions. In various embodiments, each of the sensor electrodes comprises one or more display electrodes associated with a pixel or sub pixel. In other embodiments, at least two sensor electrodes may share at least one display electrode associated with a pixel or sub-pixel.

In various embodiments, a first sensor electrode comprises one or more display electrodes configured for display updating and capacitive sensing and a second sensor electrode may be configured for capacitive sensing and not for display updating. The second sensor electrode may be disposed between substrates of the display device or external from the display device. In some embodiments, all of the sensor electrodes may comprise one or more display electrodes configured for display updating and capacitive sensing.

Processing system 110 may be configured to perform input sensing and display updating during at least partially overlapping periods. For example, a processing system 110 may simultaneously drive a first display electrode for both display updating and input sensing. In another example, processing system 110 may simultaneously drive a first display electrode for display updating and a second display electrode for input sensing. In some embodiments, processing system 110 in configured to perform input sensing and display updating during non-overlapping periods. The non-overlapping periods may be referred to as non-display update periods. The non-display update periods may occur between display line update periods of common display frame and be at least as long as a display line update period. Further, the non-display update periods may occur between display line update periods of a common display frame and be one of longer than or shorter than a display line update period. In some embodiments, the non-display update periods may occur at the beginning of a display frame and/or between display frames. Processing system 110 may be configured to drive one or more of the sensor electrodes and/or the display electrodes with a shield signal. The shield signal may comprise one of a constant voltage signal or a varying voltage signal. In various embodiments, a shield signal that is a varying voltage signal may be referred to as a guard signal. Further, one or more of the sensor electrodes and/or display electrodes may be electrically floated.

It should be understood that while many embodiments of the invention are described in the context of a fully functioning apparatus, the mechanisms of the present invention are capable of being distributed as a program product (e.g., software) in a variety of forms. For example, the mechanisms of the present invention may be implemented and distributed as a software program on information bearing media that are readable by electronic processors (e.g., non-transitory computer-readable and/or recordable/writable information bearing media readable by the processing system 110). Additionally, the embodiments of the present invention apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Figure 1B:
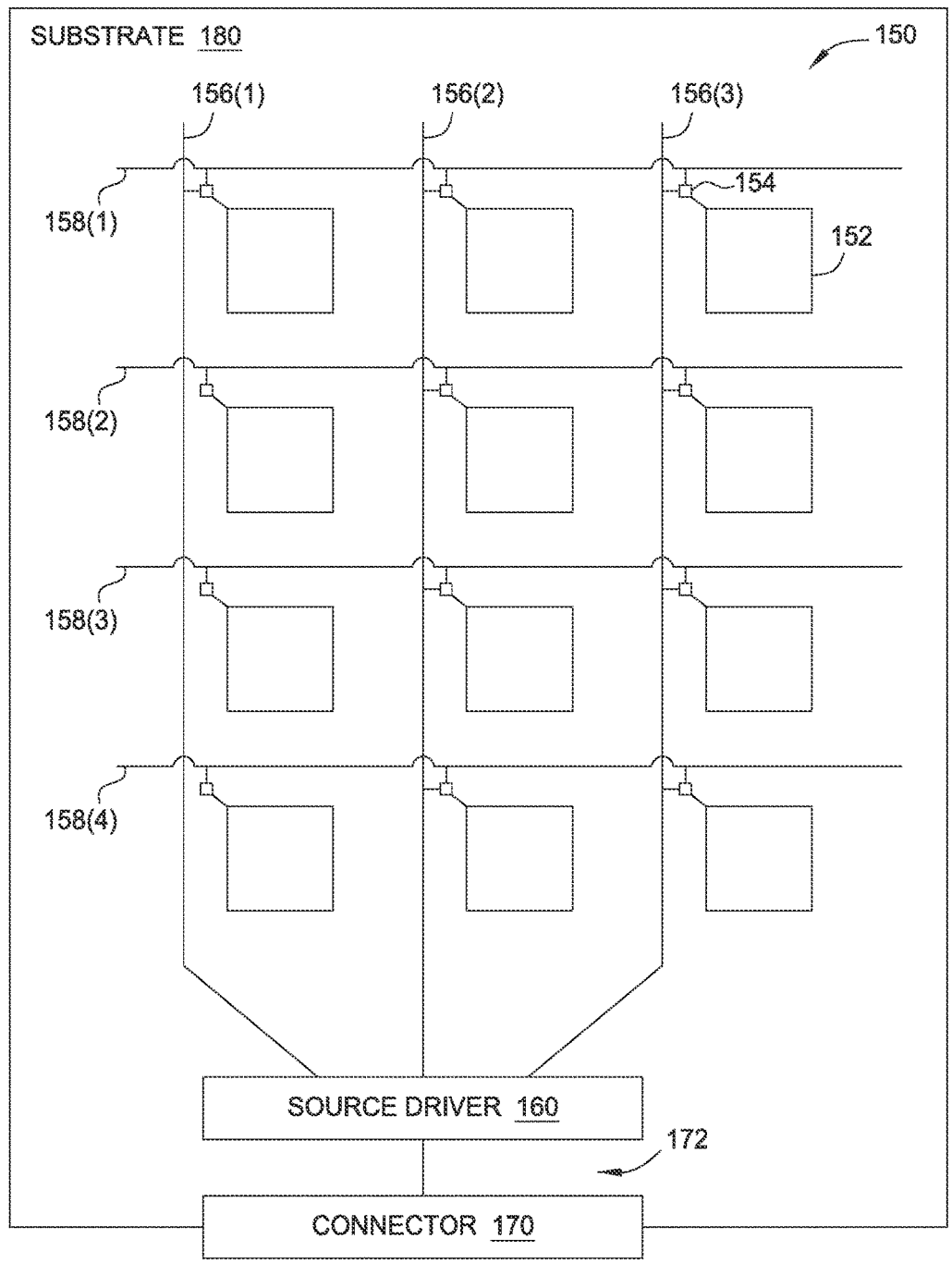
FIG. 1B is an illustration of display elements integrated with the input device of FIG. 1A, according to an example.

FIG. 1B is an illustration of display elements 150 integrated with input device 100, according to an example. As shown, display elements 150 includes sub-pixels 152, selection elements 154, gate lines 158, source lines 156, and source driver 160.

The sub-pixel elements 152 display sub-pixel colors to affect an image for display. When activated by a selection element 154, the brightness of any particular sub-pixel element 152 may be changed. To activate a selection element 154, a signal may be applied to a particular gate driver line 158 and source driver line 156 that corresponds to one or more sub-pixel elements 152 whose brightness is to be changed. The brightness of one or more sub-pixel elements 152 would then be changed, via selection element 154. Selection elements 154 may be transistors, with gates coupled to gate driver lines 158 and sources coupled to source driver lines 156.

The display elements 150 are disposed on a substrate 180, such as glass. The source driver 160 may be coupled to an off-glass timing controller or other control chip via a connector 170 disposed at least partially on the substrate 180. In one embodiment, one or more portions of the timing controller may be disposed within a host processor or any other processor within input device 100. The connector 170 provides signals and power to source driver 160 via routings 172. Input device 100 may include multiple source drivers 160, each of which is assigned to a different set of sub-pixel elements 152. Connectors 170 may be flat, flexible cables for providing a connection between an off-substrate (e.g., off-glass) control chip (such as a timing controller that controls display timing) and the source drivers 160. Various characteristics and features of the on-substrate routings between the connectors 170 and source drivers 160 may affect performance factors of input device 100 such as power consumption rate. These characteristics are described in more detail below.

The timing controller provides each source driver 160 with display update information and/or input sensing information. The source driver 160 drives source electrodes for display updating and sensor electrodes for input sensing based on the information provided by the timing controller. Each source driver 160 may communicate sensor data to the timing controller. The source drivers 160 may provide raw sensor data, partially processed or processed sensor data to the timing controller. The timing controller may process the sensor data to determine positional information for one or more input objects within a sensing region of the input device. In other embodiments, the timing controller may pass the sensor data to a host processor or other processor for further processing.

Figure 2:
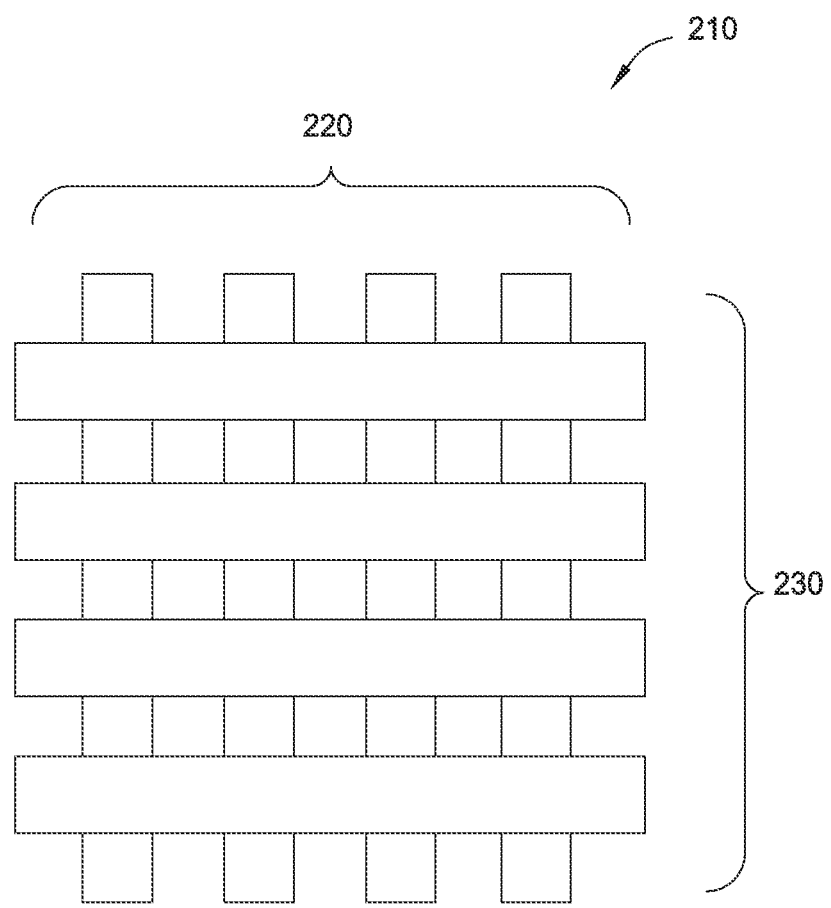
FIG. 2 shows a portion of an example sensor electrode pattern comprising sensor electrodes configured to sense in a sensing region associated with the pattern, according to some embodiments.

FIG. 2 shows a portion of an example sensor electrode pattern comprising sensor electrodes 210 configured to sense in a sensing region associated with the pattern, according to some embodiments. The example sensor electrode pattern may be included in sensing region 120 of input device 100 to perform capacitive sensing. It should be understood that although a particular pattern of sensing electrodes is shown and is described as operating in a particular manner, other patterns of sensing electrodes that operate differently may be present in input device 100 as well. For clarity of illustration and description, FIG. 2 shows a pattern of simple rectangles, and does not show various components. Further, as illustrated the sensor electrodes 210 comprise a first plurality of sensor electrodes 220, and a second plurality of sensor electrodes 230.

In one embodiment, the sensor electrodes 210 may be arranged on different sides of the same substrate. For example, each of the first and second plurality of sensor electrode(s) 220, 230 may be disposed on one of the surfaces of the substrate. In other embodiments, the sensor electrodes 210 may be arranged on different substrates. For example, each of the each of the first and second plurality of sensor electrode(s) 220, 230 may be disposed on surfaces of separate substrates which may be adhered together. In another embodiment, the sensor electrodes 210 are all located on the same side or surface of a common substrate. In one example, a first plurality of the sensor electrodes comprise jumpers in regions where the first plurality of sensor electrodes crossover the second plurality of sensor electrodes, where the jumpers are insulated from the second plurality of sensor electrodes.

The first plurality of sensor electrodes 220 may extend in a first direction, and the second plurality of sensor electrodes 230 may extend in a second direction. The second direction may be similar to or different from the first direction. For example, the second direction may be parallel with, perpendicular to, or diagonal to the first direction. Further, the sensor electrodes 210 may each have the same size or shape or differing size and shapes. In one embodiment, the first plurality of sensor electrodes may be larger (larger surface area) than the second plurality of sensor electrodes. In other embodiments, the first plurality and second plurality of sensor electrodes may have a similar size and/or shape. Thus, the size and/or shape of the one or more of the sensor electrodes 210 may be different than the size and/or shape of another one or more of the sensor electrodes 210. Nonetheless, each of the sensor electrodes 210 may be formed into any desired shape on their respective substrates.

In other embodiments, one or more of sensor electrodes 210 are disposed on the same side or surface of the common substrate and are isolated from each other in the sensing region 120. The sensor electrodes 120 may be disposed in a matrix array where each sensor electrode may be referred to as a matrix sensor electrode. Each sensor electrode of sensor electrodes 210 may be substantially similar size and/or shape. In one embodiment, one or more of sensor electrodes of the matrix array of sensor electrodes 210 may vary in at least one of size and shape. Each sensor electrode of the matrix array may correspond to a pixel of a capacitive image. Further, two or more sensor electrodes of the matrix array may correspond to a pixel of a capacitive image. In various embodiments, each sensor electrode of the matrix array may be coupled a separate capacitive routing trace of a plurality of capacitive routing traces. In various embodiments, the sensor electrodes 210 comprises one or more grid electrodes at least partially disposed between at least two sensor electrodes of sensor electrodes 210. The grid electrode and at least one sensor electrode may be disposed on a common side of a substrate, different sides of a common substrate and/or on different substrates. In one or more embodiments, the sensor electrodes 210 the grid electrode(s) may encompass an entire voltage electrode of a display device. Although the sensor electrodes 210 may be electrically isolated on the substrate, the electrodes may be coupled together outside of the sensing region 120—e.g., in a connection region. In one embodiment, a floating electrode may be disposed between the grid electrode and the sensor electrodes. In one particular embodiment, the floating electrode, the grid electrode and the sensor electrode comprise the entirety of a common electrode of a display device.

Processing system 110 may be configured to drive one or sensor electrode of the sensor electrodes 210 with modulated signals (i.e., absolute capacitive sensing signals) to determine changes in absolute capacitance of the sensor electrodes 210. In some embodiments, processing system 110 is configured to drive a transmitter signal onto a first one of the sensor electrodes 210 and receive a resulting signal with a second one of the sensor electrodes 210. The transmitter signal(s) and absolute capacitive sensing signal(s) may be similar in at least one of shape, amplitude, frequency and phase. Processing system 110 may be configured to drive a grid electrode with a shield signal to operate the grid electrode as a shield and/or guard electrode. Further, processing system 110 may be configured to drive the grid electrode with a transmitter signal such that the capacitive coupling between the grid electrode and one or more sensor electrodes may be determined, or with an absolute capacitive sensing signal such that the absolute capacitance of the grid electrode may be determined.

As used herein, a shield signal refers to a signal having one of a constant voltage or a varying voltage signal (guard signal). The guard signal may be substantially similar in at least one of amplitude and phase to a signal modulating a sensor electrode. Further, in various embodiments, the guard signal may have an amplitude that is larger than or less than that of the signal modulating a sensor electrode. In some embodiments, the guard signal may have a phase that is different from the signal modulating the sensor electrode. Electrically floating an electrode can be interpreted as a form of guarding in cases where, by floating, the second electrode receives the desired guarding waveform via capacitive coupling from a nearby driven sensor electrode of the input device 100.

As is discussed above, in any of the sensor electrode arrangements discussed above, the sensor electrodes 210 may be formed on a substrate that is external to or internal to the display device. For example, the sensor electrodes 210 may be disposed on the outer surface of a lens in the input device 100. In other embodiments, the sensor electrodes 210 are disposed between the color filter glass of the display device and the lens of the input device. In other embodiments, at least a portion of the sensor electrodes and/or grid electrode(s) may be disposed such that they are between a Thin Film Transistor substrate (TFT substrate) and the color filter glass of the display device. In one embodiment, a first plurality of sensor electrodes are disposed between the TFT substrate and color filter glass of the display device and the second plurality of sensor electrodes are disposed between the color filter glass and the lens of the input device 100. In yet other embodiments, all of sensor electrodes 210 are disposed between the TFT substrate and color filter glass of the display device, where the sensor electrodes may be disposed on the same substrate or on different substrates as described above.

In any of the sensor electrode arrangements described above, the sensor electrodes 210 may be operated by the input device 100 for transcapacitive sensing by dividing the sensor electrodes 210 into transmitter and receiver electrodes or for absolute capacitive sensing, or some mixture of both. Further, one or more of the sensor electrodes 210 or the display electrodes (e.g., source, gate, or reference (Vcom) electrodes) may be used to perform shielding.

The areas of localized capacitive coupling between first plurality of sensor electrodes 220 and second plurality of sensor electrodes 230 may be termed "capacitive pixels." The capacitive coupling between the first plurality of sensor electrodes 220 and second plurality of sensor electrodes 230 changes with the proximity and motion of input objects in the sensing region associated with the first plurality of sensor electrodes 220 and second plurality of sensor electrodes 230. Further, the areas of localized capacitance between the first plurality of sensor electrodes 220 and an input object and/or the second plurality of sensor electrodes 230 and an input object may also be termed "capacitive pixels". As such, the absolute capacitance of the first plurality of sensor electrodes 220 and/or the second plurality of sensor electrodes changes with the proximity and motion of an input object in the sensing region associated with the first plurality of sensor electrodes 220 and second plurality of sensor electrodes 230.

In some embodiments, the sensor pattern is "scanned" to determine these capacitive couplings. That is, in one embodiment, the first plurality of sensor electrodes 220 are driven to transmit transmitter signals. Transmitters may be operated such that one transmitter electrode transmits at one time, or multiple transmitter electrodes transmit at the same time. Where multiple transmitter electrodes transmit simultaneously, these multiple transmitter electrodes may transmit the same transmitter signal and effectively produce an effectively larger transmitter electrode, or these multiple transmitter electrodes may transmit different transmitter signals. For example, multiple transmitter electrodes may transmit different transmitter signals according to one or more coding schemes that enable their combined effects on the resulting signals of second plurality of sensor The receiver sensor electrodes 170 may be operated singly or multiply to acquire resulting signals. The resulting signals may be used to determine measurements of the capacitive couplings at the capacitive pixels.

In other embodiment, scanning the sensor pattern comprises driving one or more sensor electrode of the first and/or second plurality of sensor electrodes of with absolute sensing signals while receiving resulting signals with the one or more sensor electrodes. The sensor electrodes may be driven and received with such that one second electrode is driven and received with at one time, or multiple sensor electrodes driven and received with at the same time. The resulting signals may be used to determine measurements of the capacitive couplings at the capacitive pixels or along each sensor electrode.

A set of measurements from the capacitive pixels form a "capacitive frame". The capacitive frame may comprise a "capacitive image" representative of the capacitive couplings at the pixels and/or a "capacitive profile" representative of the capacitive couplings or along each sensor electrode. Multiple capacitive frames may be acquired over multiple time periods, and differences between them used to derive information about input in the sensing region. For example, successive capacitive frames acquired over successive periods of time can be used to track the motion(s) of one or more input objects entering, exiting, and within the sensing region.

The background capacitance of a sensor device is the capacitive frame associated with no input object in the sensing region. The background capacitance changes with the environment and operating conditions, and may be estimated in various ways. For example, some embodiments take "baseline frames" when no input object is determined to be in the sensing region, and use those baseline frames as estimates of their background capacitances.

Capacitive frames can be adjusted for the background capacitance of the sensor device for more efficient processing. Some embodiments accomplish this by "baselining" measurements of the capacitive couplings at the capacitive pixels to produce a "baselined capacitive frames." That is, some embodiments compare the measurements forming a capacitance frames with appropriate "baseline values" of a "baseline frames", and determine changes from that baseline image.

Figure 3:
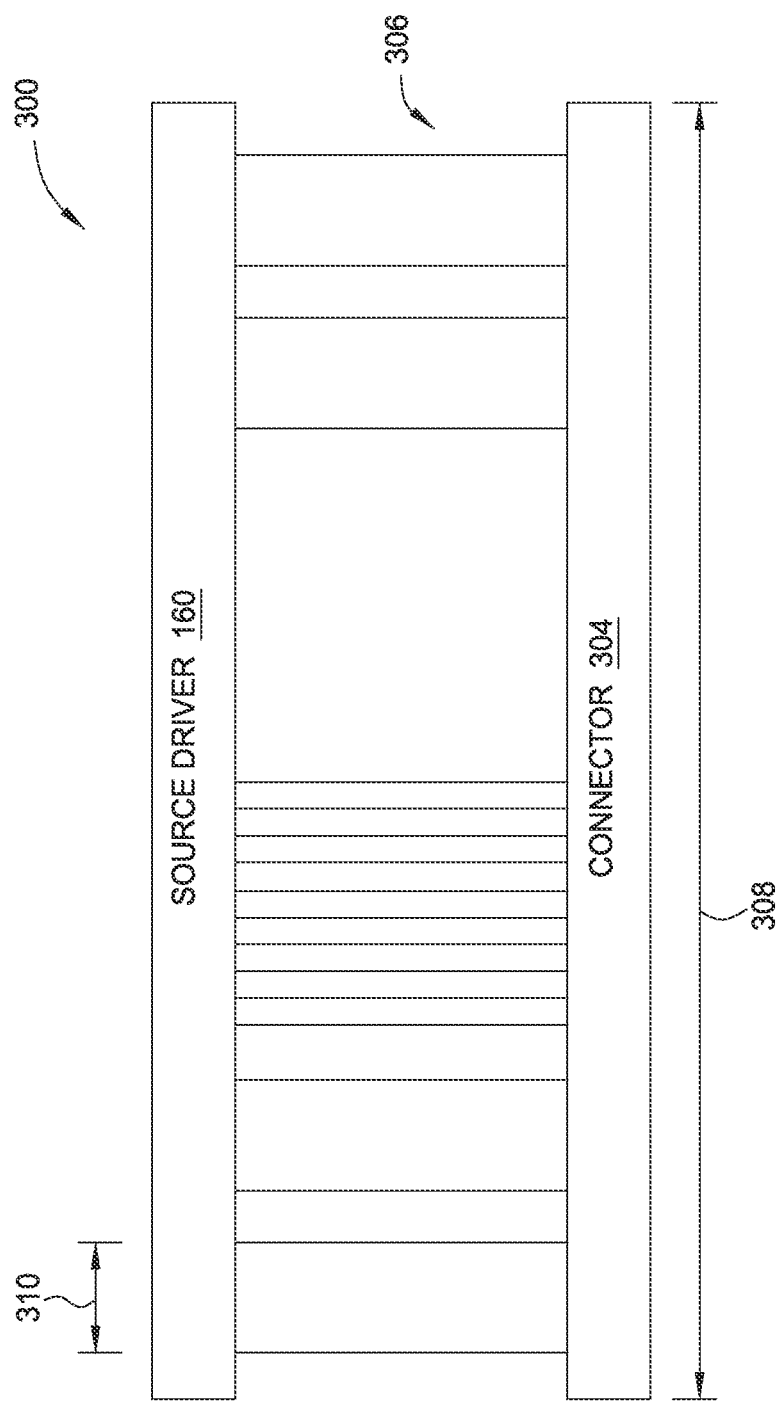
FIG. 3 is a block diagram of a connector interface, according to an example.

FIG. 3 is a block diagram of a connector interface 300, according to an example. The connector interface 300 includes a source driver 302 (which may be similar to source driver 160) which is coupled to a connector 304 (which may be similar to connector 170) via connection traces 306 (which may be similar to routings 172). The connection traces 306 provide signals and power to source driver 302 so that source driver may drive source lines 156 for display updating.

The widths of the connection traces 306 are dependent on the width 308 of the connector interface 300. Specifically, because the connection traces 306 are lined up in a width-wise direction, each connection trace 306 occupies a certain portion of the width 308 of the connector interface 300.

In general, in the configuration illustrated in FIG. 3, in which one connector 304 provides signals to one source driver 160, the width of the various traces 306 (such as width 310 of a connector trace 306) are deemed to be sufficient to provide low enough resistance delivery of signal and power to source driver 160. However, in some situations, traces for a different ratio of connectors 304 to source drivers 160 such as 2-to-1 may have different, less desirable resistance characteristics, as described below.

Figure 4:
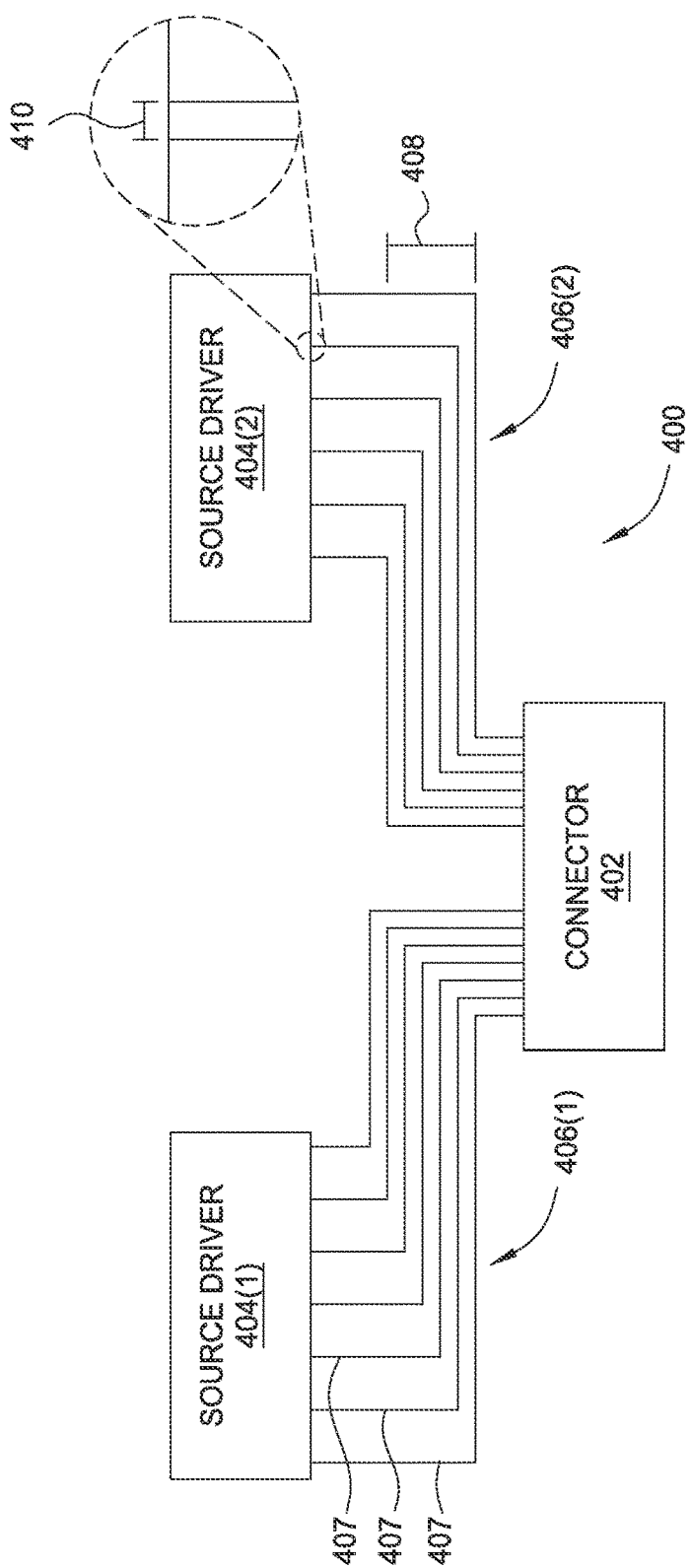
FIG. 4 is a block diagram of a two-to-one connector interface, according to an example.

FIG. 4 is a block diagram of a two-to-one connector interface 400, according to an example. In some situations, it may be desirable to reduce the number of connectors 304 that provide power and signals to source drivers 302. For example, fewer connectors 304 may lead to lower cost of manufacture or may provide other benefits. The two-to-one connector interface 400 is an interface in which one connector 404 supplies power and signals for two different source drivers 402. The connector 402 is coupled to source drivers 404 via traces 407, which carry power and signals to the source driver 404.

For the two-to-one connector interface 400, a horizontal diversion of traces 407 may be used to route between the single connector 402 and two the source drivers 404. The horizontal diversion of the traces 407 means that the width available for routing is decreased as compared with the width 308 available in the one-to-one connector interface 300 (FIG. 3). For example, traces 407 cross through a horizontal area having width 408, which is much smaller than the width 308 available with the one-to-one connector interface 300 (FIG. 3). The reduction in width means that the traces are narrower, which means that resistance of the traces increases. Higher resistance leads to greater power dissipation, which may negatively affect characteristics of an input device that includes the two-to-one connector interface 400 such as battery life and the like.

Figure 5:
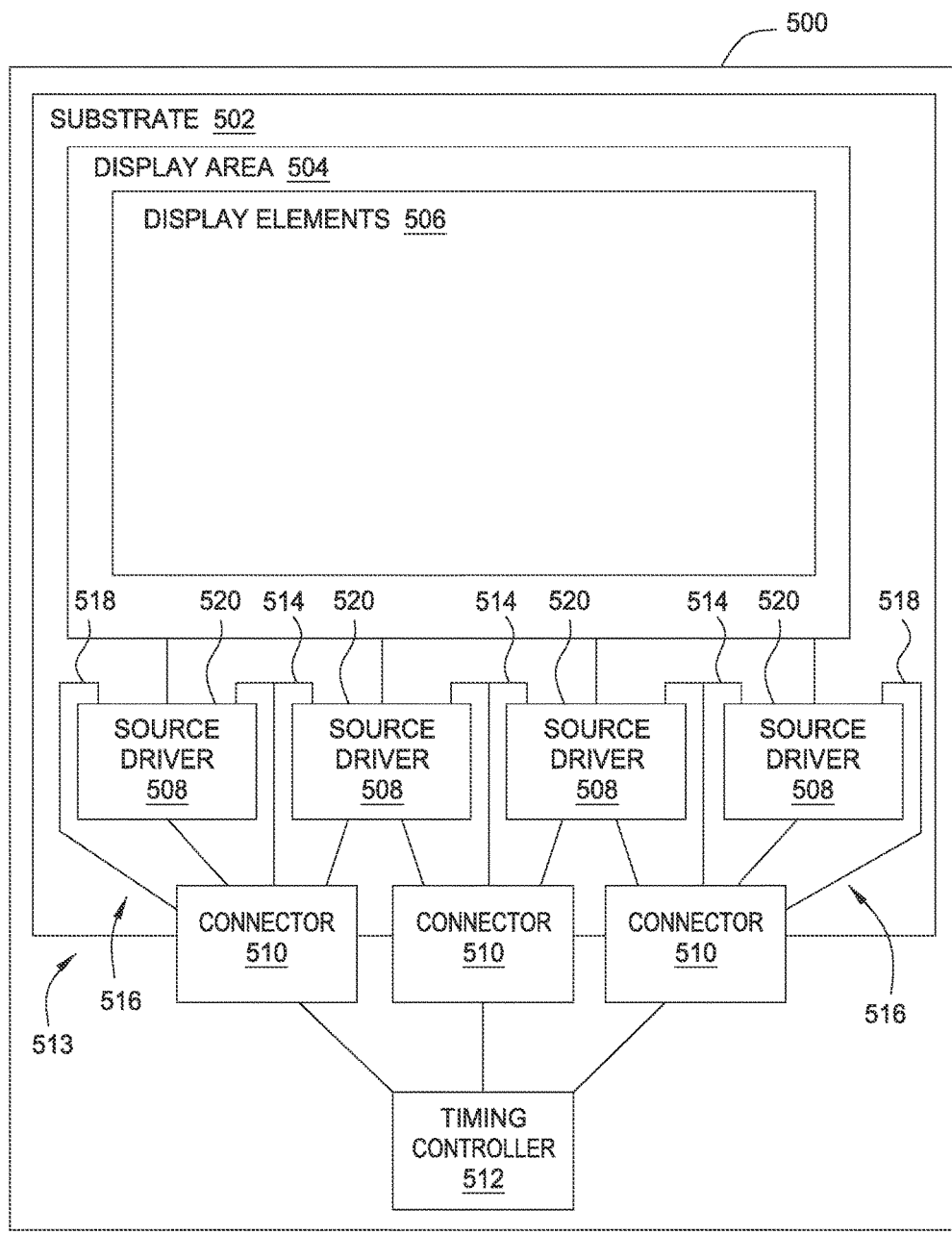
FIG. 5 is a schematic diagram of an input device employing an improved scheme for routing between connectors and source drivers, according to an example.

FIG. 5 is a schematic diagram of an input device 500 employing an improved scheme for routing between connectors and source drivers, according to an example. The input device 500 includes a substrate 502 on which display related elements are disposed, a timing controller 512 for controlling the display related elements, and connectors 510 for communicatively coupling the timing controller 512 to the display related elements. The substrate 502, as well as all elements disposed on the substrate 502 (including the connector 510) may be referred to herein as a display assembly. The timing controller 512 is coupled, via connectors 510, and via routing configuration 513 (a series of traces laid out between connectors 510 and source drivers 508), to source drivers 508. Source drivers 508 drive the display elements 506 (e.g., sub-pixels) within display area 504 on substrate 502 for display. In some embodiments, display elements 506 may also include input sensing elements and source drivers 508 may drive input sensing elements for sensing. Substrate 502 may be a glass substrate having optical characteristics associated with providing optical display. Connectors 510 provide an interface between the off-substrate timing controller 512 and the on-substrate source drivers 508.

Signals are provided between connectors 510 and source drivers 508 via a routing configuration 513, which includes traces for individual signals and power routed between connectors 510 and source driver 508. The connections between connector 510 and source driver are illustrated in FIG. 5 as trace group 516 and t-shaped connectors 514, as well as edge connectors 518. The trace group 516 includes multiple traces that provide power and data signals to source drivers 508. The t-shaped connectors 514, as described above, are traces that provide power to top edges 520 of source drivers 508. In some embodiments, for top edges 520, through silicon vias or similar technology are used to route power and/or signal through the die of source driver 508. The edge connectors 518 provide power, similarly to t-shaped connectors 514, to the top-left corner of left-most source driver and the top-right corner of the right-most source driver. The trace groups 516, t-shaped connectors 514, and edge connectors 518 are depicted schematically in FIG. 5, without showing the specific geometry of various traces included therein. However, further detail regarding trace geometries is provided below.

Unlike the configuration illustrated in FIG. 4, the input device 500 includes a ratio of three connectors 510 to four source drivers 508. This is an intermediate configuration between the one-to-one ratio illustrated in FIG. 3 and the two-to-one ratio illustrated in FIG. 4. The number of connectors 510 utilized in the configuration including the three-to-four ratio is fewer than using the one-to-one ratio, thus reducing manufacturing costs as compared with that configuration. Note that although a three-to-four ratio is shown, other ratios are possible.

Several techniques are disclosed herein for improving the resistance of the traces between connectors 510 and source drivers 508. Other techniques are also disclosed for improving other characteristics of the traces including noise performance, voltage matching, and other characteristics.

One technique is the use of t-shaped connectors 514 to even out voltage provided to both source drivers 508. The voltage provided via the t-shaped connectors 514 is the power supply for the source lines that drive the display elements 506. If the voltage provided to two adjacent source drivers 508 is uneven, a visual artifact may appear on screen, since brightness level is dependent on voltage. This brightness difference may appear as a noticeable vertical line through the display, which is undesirable. The t-shaped connector 514 is discussed in further detail below.

Another technique is the use of tapering for traces. Specifically, certain traces may have width that varies along its length. Increasing width at certain points of the trace reduces total resistance of the trace. This is because traces can be modeled as a set of resistors connected in series. Wider segments of traces have lower resistance, lowering the total resistance of the trace.

Additional features are provided for improving various aspects of the routing configuration 513 and are discussed in further detail below. One such feature includes a noise filtering corner connector (not shown in FIG. 5 but discussed in further detail below) that provides filtering between different types of power supplies. Another such feature is that the traces included in the routing configuration 513 include stacked power supply and ground traces. The traces are stacked in that the planes of the traces are parallel to each other, forming a "parallel plate capacitor." This stacked configuration provides certain benefits, including providing decoupling capacitance. Further detail regarding these additional features (the noise filtering connector and the stacked traces) are provided below.

Note that, as described above, FIG. 5 illustrates routing between connectors 510 and source drivers 508 schematically and therefore does not necessarily show the details of all aspects of the features described above. Such further details are provided below with reference to additional figures.

Figure 6A:
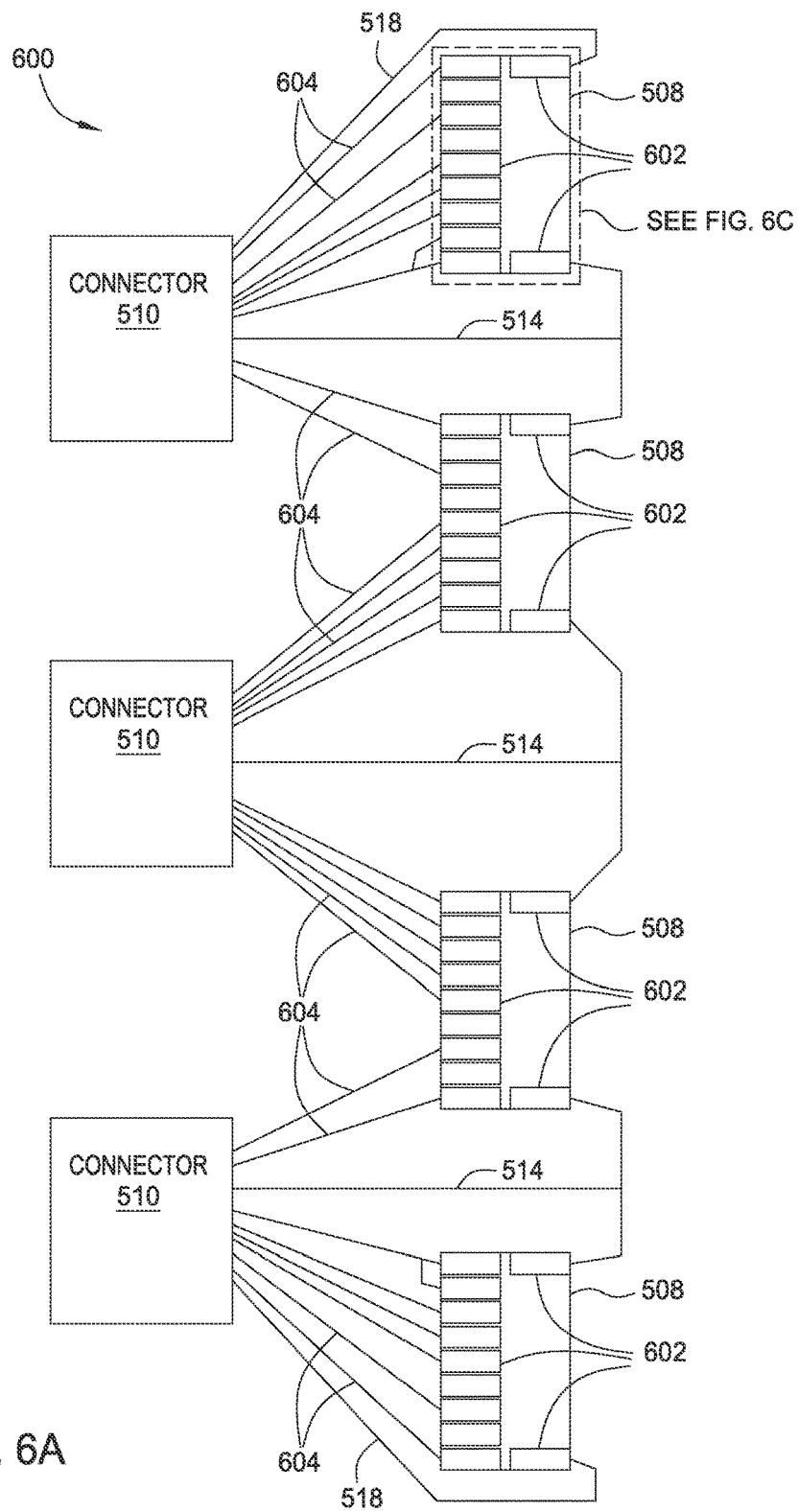
FIG. 6A illustrates a three-to-four ratio of connectors to source drivers, according to an example.
Figure 6B:
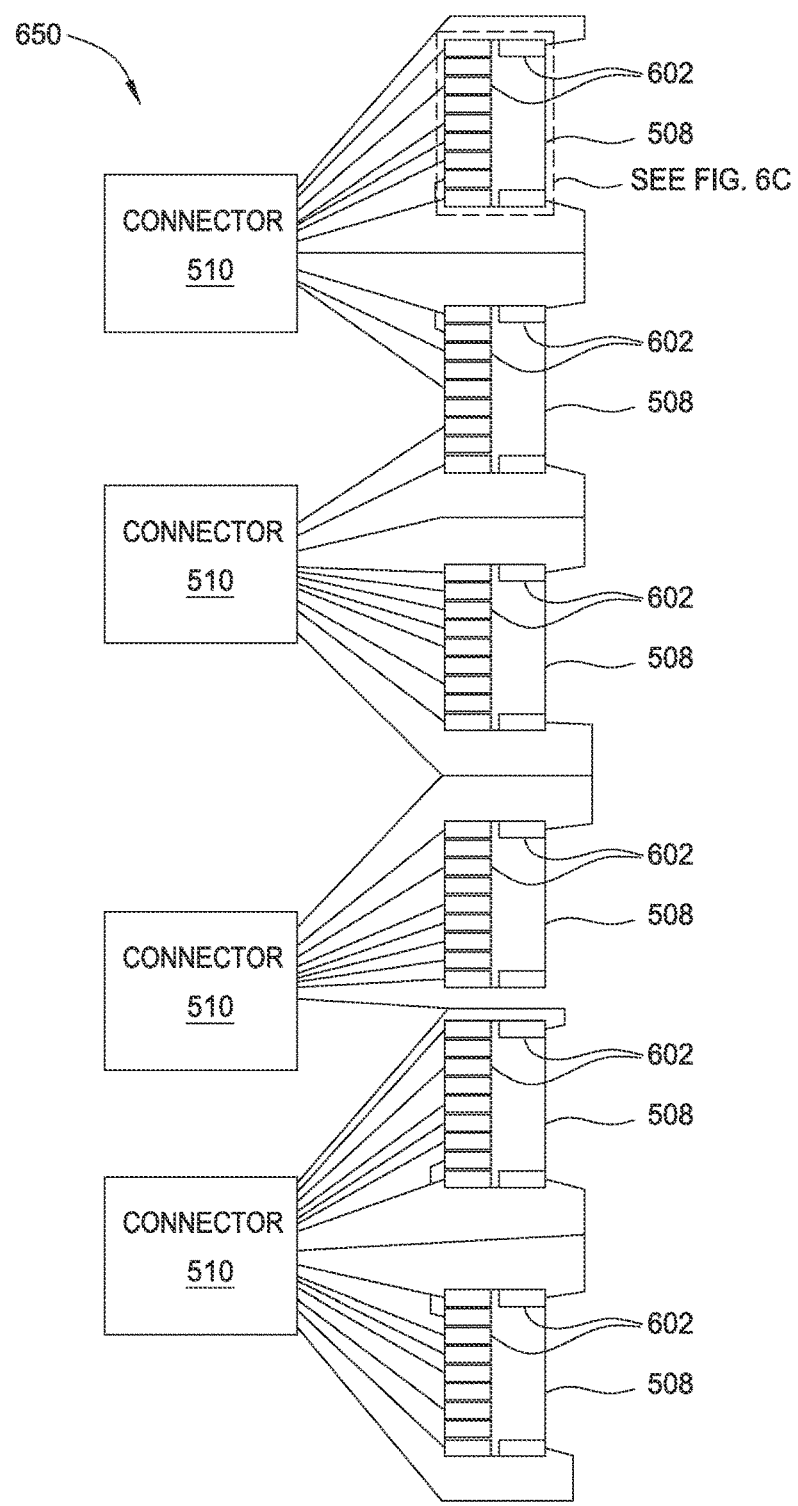
FIG. 6B illustrates a four-to-six ratio of connectors to source drivers, according to an example.

FIGS. 6A-6B are schematic diagrams that illustrate example schemes by which power and signal routing to source drivers 508 is divided between connectors 510. These figures illustrate specific pin inputs for the source drivers 508 and the manner in which connectors 510 provide power and data to the pin inputs. FIG. 6A illustrates a three-to-four ratio of connectors 510 to source drivers 508 and FIG. 6B illustrates a four-to-six ratio of connectors 510 to source drivers 508.

In the three-to-four configuration 600 of FIG. 6A, three connectors 510 provide data and power to four source drivers 508. More specifically, three connectors 510 provide data and power via t-shaped connectors 514, traces 604, and edge connectors 518, to source drivers 508, at input pins 602. Different input pins 602 are assigned different functions as described in further detail below. Analogously, in the four-to-six configuration 650 of FIG. 6B, four connectors 510 provide data and power to six source drivers 508.

Note that although certain ratios between connectors 510 and source drivers are illustrated, and that certain connections between connectors 510 and source driver inputs are illustrated, it should be understood that other ratios and pin connections are consistent with the disclosure provided herein.

Figure 6C:
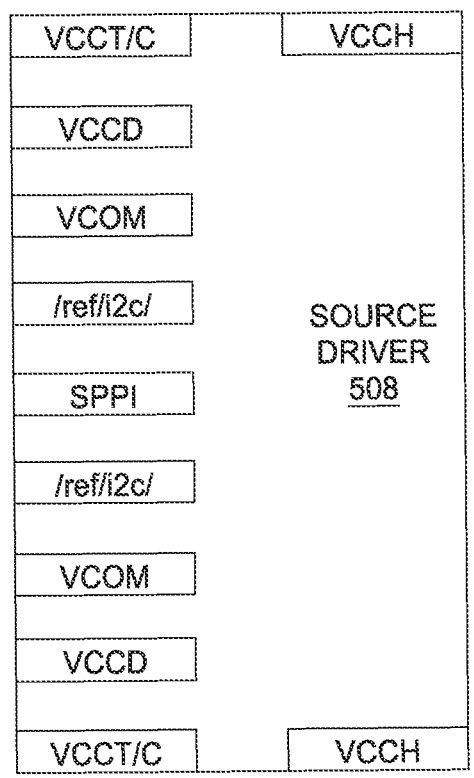
FIG. 6C is a block diagram of a source driver, illustrating input pins in greater detail, according to an example.

FIG. 6C is a block diagram of a source driver, illustrating input pins 602, in greater detail, according to an example. As shown, source driver 508 includes input pins labeled "VCCH," "VCCT/C," "VCCD," "VCOM," "/ref/i2c/," and "SPPI." VCCH, VCCT/C, and VCCD are power supply input pins. These pins receive power for different functions of the source driver 508. VCCH is the power supply for the source driver lines 156 illustrated in FIG. 1B. Because the source driver lines 156 affect the colors displayed in display area 504, the voltage at the VCCH input has a direct effect on what is shown in the display area 504. VCCT/C powers the analog front end for touch processing. The analog front end includes circuitry that performs analog processing such as sampling and filtering, as well as analog-to-digital conversion for signals received from touch sensing electrodes during capacitive touch sensing. VCCD provides power to a digital logic core that performs various processing functions such as digital signal processing, control of source drivers 508 based on inputs, and other functions. VCOM (or "common voltage") is a reference voltage for display. Specifically, source driver 508 charges a common display electrode to voltage VCOM. This common display electrode serves as a reference against which sub-pixel electrodes are charged in order to change the sub-pixel brightness. /ref/i2c/ is a reference signal. SPPI is a high speed data transmission line that provides display data and touch data for controlling touch and display elements of input device 500. Note that although specific inputs are shown, those of skill in the art will understand that source drivers with different inputs and/or different arrangements of the inputs are in accordance with the present disclosure.

Referring to FIGS. 6A and 6C together, the manner in which inputs to source drivers 508 are split is now described. For the top-most source driver 508, a top-most connector 510 is connected to VCCT/C, VCOM, SPPI, /ref/i2c, VCOM, VCCD, and VCCT/C through traces 604, to a top-most VCCH via edge connector 518, and to a bottom-most VCCH via t-shaped connector 514. For the next source driver down, the top VCCH is connected, via a t-shaped connector 514, to the top-most connector 510, and the top-most VCCT/C and VCOM are connected to the top-most connector 510 via traces 604. SPPI is connected to a middle connector 510, as are /ref/i2c/, VCOM, VCCD, and VCCT/C through traces 504, and the bottom-most VCCH via t-shaped connector 514. The middle connector 510 is also coupled to the top-most VCCH of the next-further-down source driver 508 via a t-shaped connector 514 as well as to the top-most VCCT/C, VCCD, VCOM, and /ref/i2c/, and to SPPI via traces 604. The bottom-most VCOM and VCCT/C are coupled to the bottom-most connector 510 via traces 604 and the bottom-most VCCH is coupled to the bottom-most connector 510 via t-shaped connector 514. All inputs included in the bottom-most source driver 508 except for the bottom-most /ref/i2c/ and VCCD are coupled to the bottom-most connector 510 as shown. In FIG. 6B, the input pins of the different source drivers 602 are coupled to the connectors 510 as shown. Edge connectors 518 connect to VCCH for source drivers 508 at the edges (i.e., bordering only one other source driver 508). Note that although specific connections to pins are illustrated, it should be understood that other ways of splitting inputs between connectors 510 are within the scope of this disclosure.

Figure 7A:
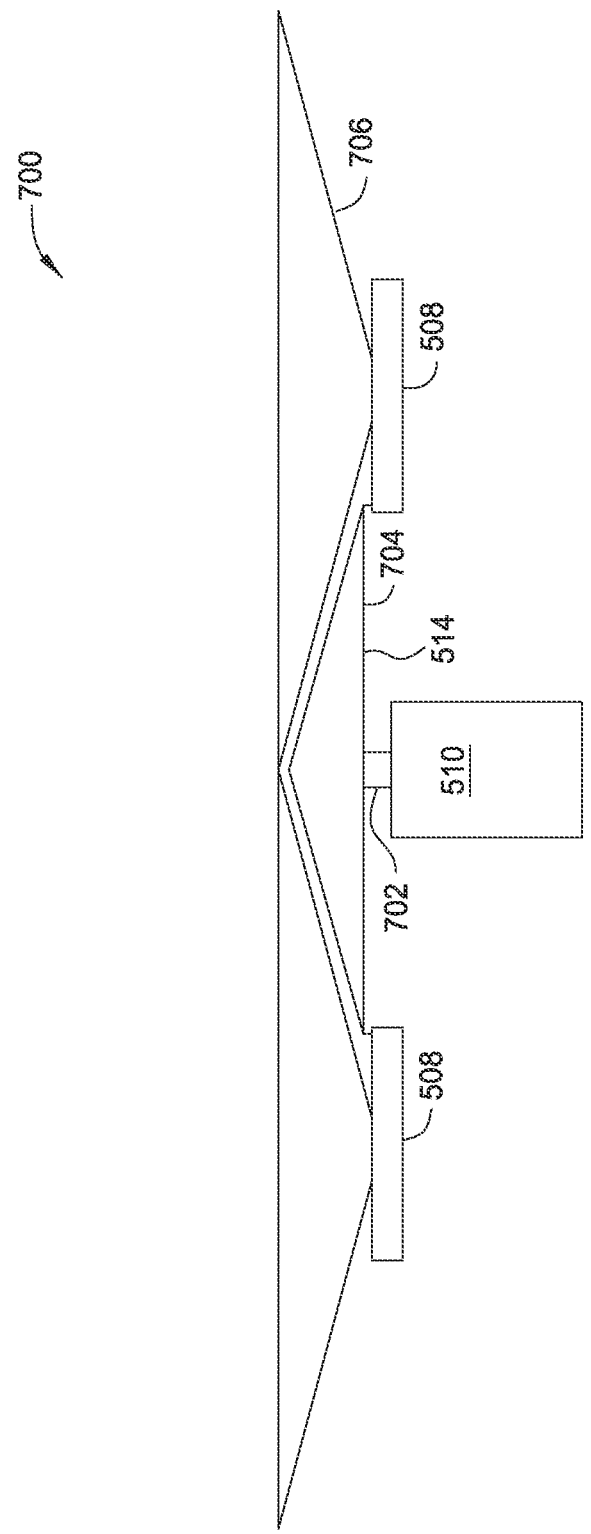
FIG. 7A is a block diagram of a t-shaped connector, according to an example.
Figure 7B:
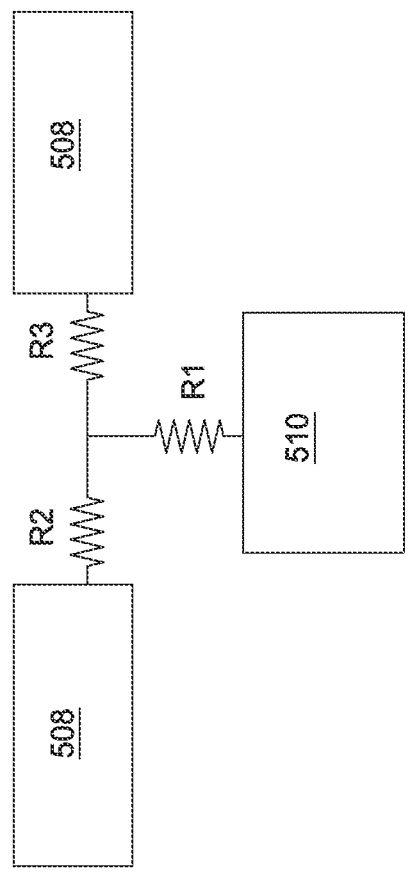
FIG. 7B is a circuit diagram that is representative of the t-shaped connector of FIG. 7A, according to an example.

FIGS. 7A and 7B illustrate a t-shaped connector 514 in greater detail, according to an example. FIG. 7A is a block diagram of the t-shaped connector 514 and FIG. 7B is a circuit diagram that is representative of the t-shaped connector 514. The t-shaped connector 514 is illustrated in the context of two adjacent source drivers 508. The t-shaped connector 514 includes a high resistance base portion 702 connected to connector 510 and a low resistance top portion 704 connected to the high resistance base portion 702 and to the VCCH input pin of the source drivers 508. The base portion 702 has a low width such that the resistance of the base portion 702 is high relative to the top portion 704. The low resistance top portion 704 has a large area to reduce resistance, which is accomplished by occupying available space between the source driver line fanouts 706. In some examples, the top portion 704 may be routed in a fanout region. In some other examples, the top portion 704 may be said to have a complementary shape to the shape of the fanouts 706. The complementary shape may be a triangular or trapezoidal shape having upper edges that face and approximately align with the edges of the fanouts 706. These source driver line fanouts 706 are lines that provide source driver signals to the source driver lines 156 illustrated in FIG. 1B from source drivers 508.

As shown in FIG. 7B, the t-shaped connector can be modeled as three resistors coupled together as shown. Resistor R1 represents the base portion 702, resistor R2 represents the left side (e.g., left half) of the top portion 704 and resistor R3 represents the right side (e.g., right half) of the top portion 704. Because the resistance R1 is much higher than resistances R2 or R3, R1 is said to dominate and the voltage at inputs 702 to source drivers 508 are roughly equal. As stated above, the t-shaped connector powers the source driver lines (e.g., lines 156) and thus affect the colors seen in display area 506. Use of the t-shaped connector, which provides nearly equal voltage to the source driver line power for two adjacent source drivers 508 helps to prevent a visual artifact consisting of a noticeable vertical line through the display area 504 (i.e., of brightness differences).

Figure 8A:
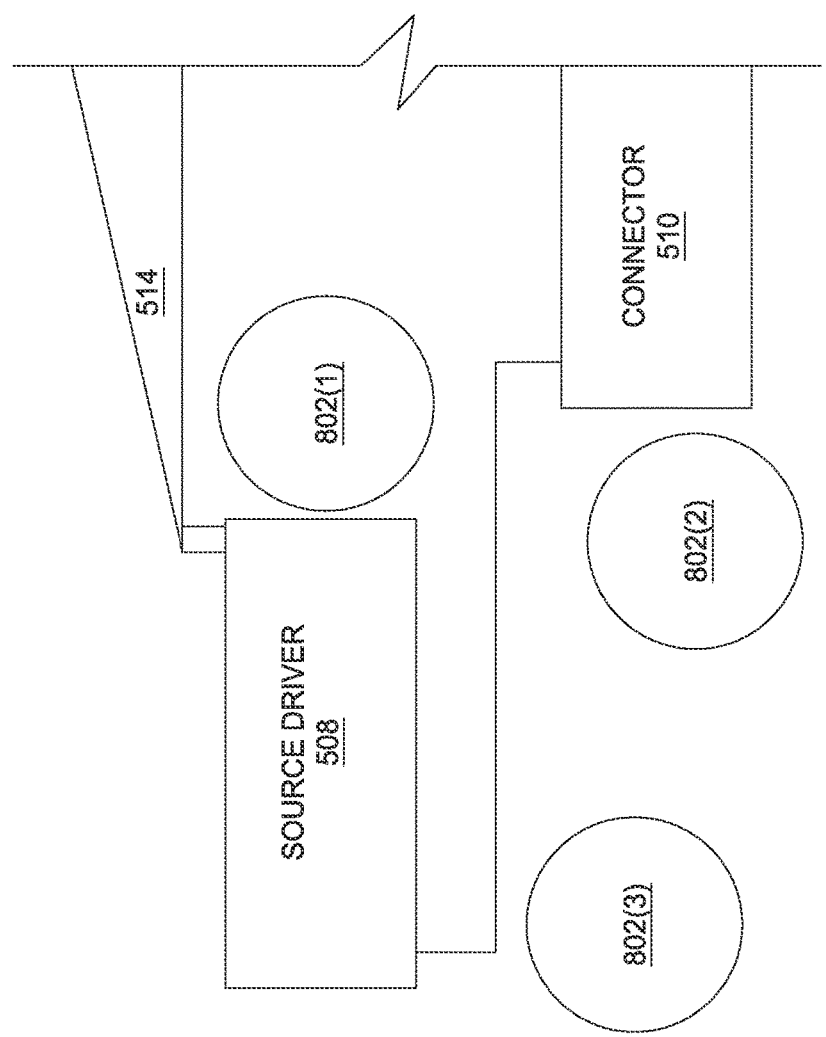
FIG. 8A is a schematic diagram of a routing interface between a connector and a source driver, according to an example.
Figure 8B:
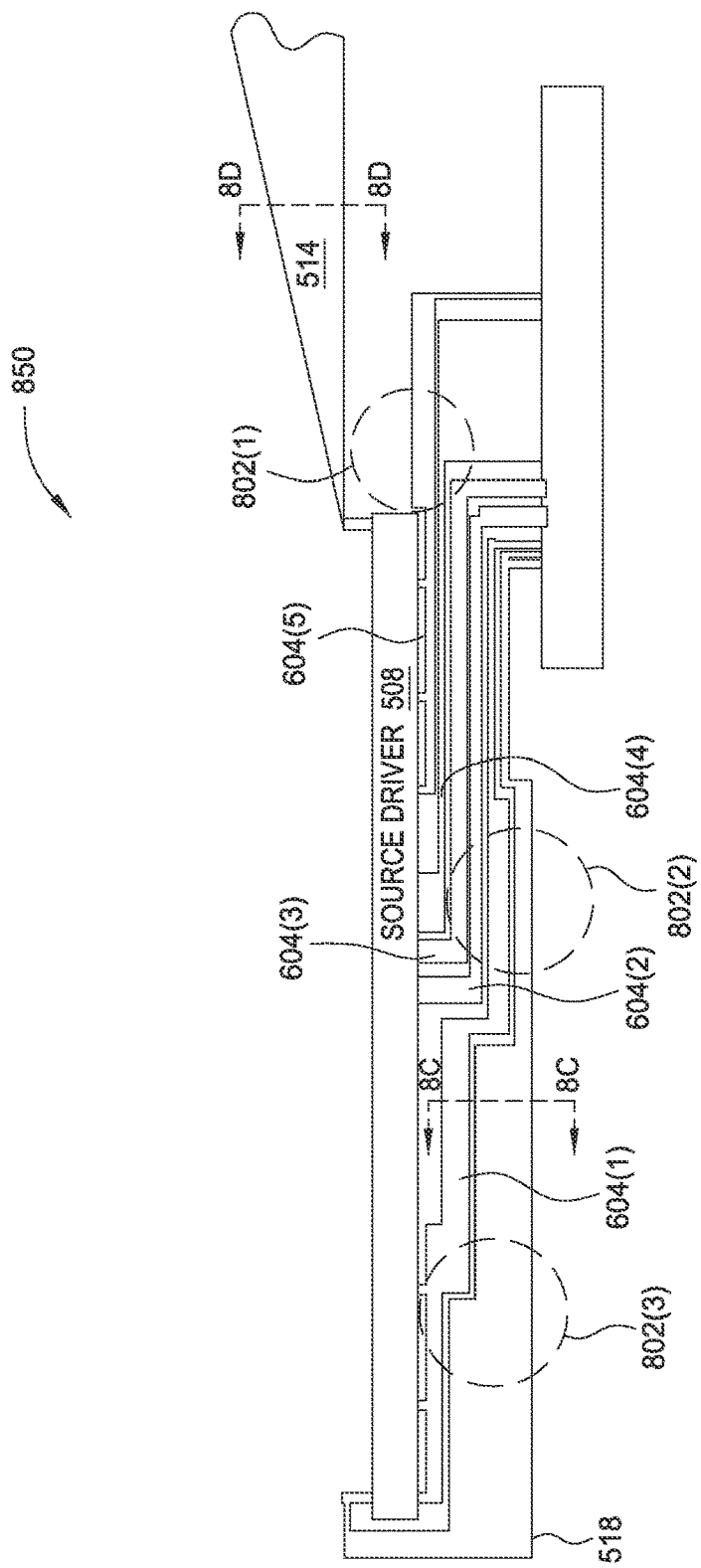
FIG. 8B is a block diagram of a trace layout illustrating trace geometry features described with respect to FIG. 8A, according to an example.

FIGS. 8A and 8B illustrate the tapering of traces (e.g., traces 604 and edge connectors 518) in the area between connector 510 and source drivers 508. Tapering refers to a change (increase or decrease) in width of the traces along their length. Note that for clarity, a connection between one connector 510 and one source driver 508 is illustrated. However, it should be understood that the specific trace geometry used may be varied and/or may be duplicated to accommodate other connector/source driver connections within an input device 500.

FIG. 8A is a schematic diagram of a routing interface 800 between connector 510 and source driver 508, according to an example. The routing interface 800 includes three different areas 802—a first area 802(1), a second area 802(2), and a third area 802(3).

The first area 802(1) includes space to the side of source driver 508 and below the t-shaped connector 514. The second area 802(2) includes space to the side of connector 510 and below source driver 508. The third area 802(3) includes space below source driver 508 but farther from connector 510 than second area 802(2). Specific geometric features are applied to traces depending on which area 802 the traces fall in.

More specifically, traces that are near to the bottom edge of source driver 508 may be extended into the first area 802(1), which increases the area of those traces, decreasing their resistance. Traces that are near to connector 510, in area 802(2) are generally horizontally aligned and may be increased in width to occupy a larger amount of area in order to reduce resistance. Traces in area 802(3) may have a shape that changes direction (e.g., horizontal, then vertical, then horizontal) and also that expands in width to consume area left over by traces that have connected to source driver 508 already.

FIG. 8B is a block diagram of a trace layout 850 illustrating trace geometry features described with respect to FIG. 8A, according to an example. Trace layout 850 illustrates a number of traces 604, an edge connector 518, and a t-shaped connector 514. Edge connector 518 provides power to VCCH. Trace 604(1) provides power to VCCC/T and VCCD. Trace 604(2) provides data to SPPI. Trace 604(3) provides VCOM. Trace 604(4) provides /ref/i2c/. Trace 604(5) provides power to VCCC/T and VCCD. T-shaped connector provides power to VCCH.

A first area 802(1), second area 802(2), and third area 802(3), which are areas in which trace geometry is varied (e.g., "tapered") to improve resistance characteristics, are shown. Within first area 802(1), a trace 604(5), which provides power for VCCD and VCCC/T has width that extends into a region to the side of source driver 508. This widening of the trace 604(5) decreases resistance of the trace and improves power delivery. Within second area 802(2), which is an area below source driver 508 that roughly corresponds to the horizontal middle of source driver 508, trace 604(1) and edge connector 518 are expanded downward away from source driver 508, which improves their resistance. Trace 604(1) couples to VCCD and VCCC/T and edge connector 518 couples to VCCH. In third area 802(3), trace 604(1) and edge connector 518 extend back upwards towards source driver 508, occupying space that is freed because other traces are not present in third area 802(3), having already been connected to source driver 508.

Figure 8C:
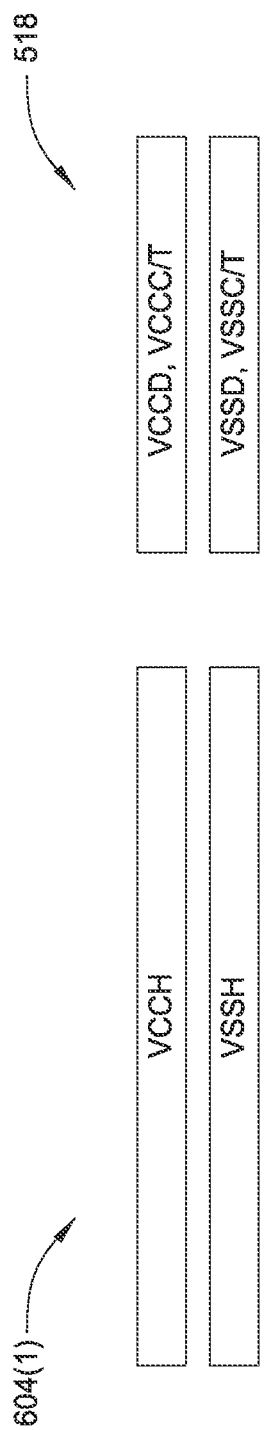
FIG. 8C is a cross-sectional view of trace layout taken along lines 8C-8C of FIG. 8B, according to an example.
Figure 8D:
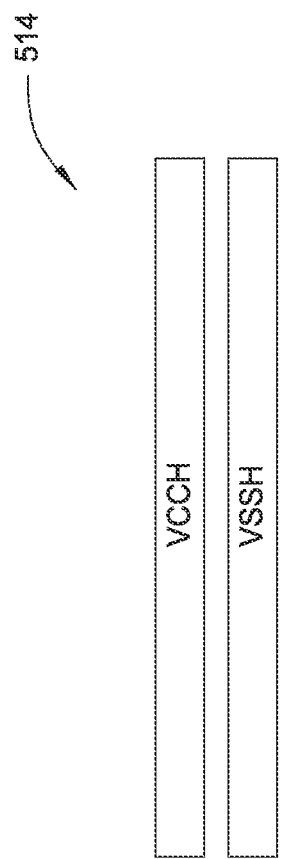
FIG. 8D is a cross-sectional view of trace layout taken along lines 8D-8D of FIG. 8B, according to an example.

Two different cross-section indicators are illustrated in FIG. 8B: one for FIG. 8C and another for FIG. 8D. The cross-sections shown in these Figures illustrate trace stacking for improved power delivery. Although specific locations are chosen to illustrate trace stacking, it should be understood that various traces may include stacked elements for improved power delivery.

FIG. 8C is a cross-sectional view of trace layout 850 taken along lines 8C-8C of FIG. 8B, according to an example. Two elements are shown: trace 604(1) and edge connector 518. Trace 604(1), as shown in FIG. 8B, provides power for VCCD and VCCC/T (the digital core and the touch analog front end, respectively). Edge connector 518 provides power for VCCH (the source driver lines).

Each of trace 604(1) and edge connector 518 comprises two components: a power line and a ground line. Trace 604(1) includes a component labeled VCCH, which is the power line and VSSH, which is ground. Stacking power and ground as shown provides some decoupling capacitance for the power supply. Decoupling capacitance is a feature that reduces noise experienced by the element being powered by the power supply. More specifically, with decoupling capacitance included in the routing trace, that capacitance can be discharged when power drawn by the source driver 508 exceeds the amount of power that can be provided by the power supply line and can be charged during other times. This reduces noise in the power supply signal provided to source driver 508.

FIG. 8D is a cross-sectional view of trace layout 850 taken along lines 8D-8D of FIG. 8B, according to an example. In FIG. 8D, the element that is shown is t-shaped connector 514. As with the elements shown in FIG. 8C, the t-shaped connector 514 includes two stacked elements, labeled VCCH, which provides power, and VSSH, which acts as ground. These two stacked elements provide decoupling capacitance to the power supply for the source driver lines, with attendant benefits as described above.

Figure 9A:
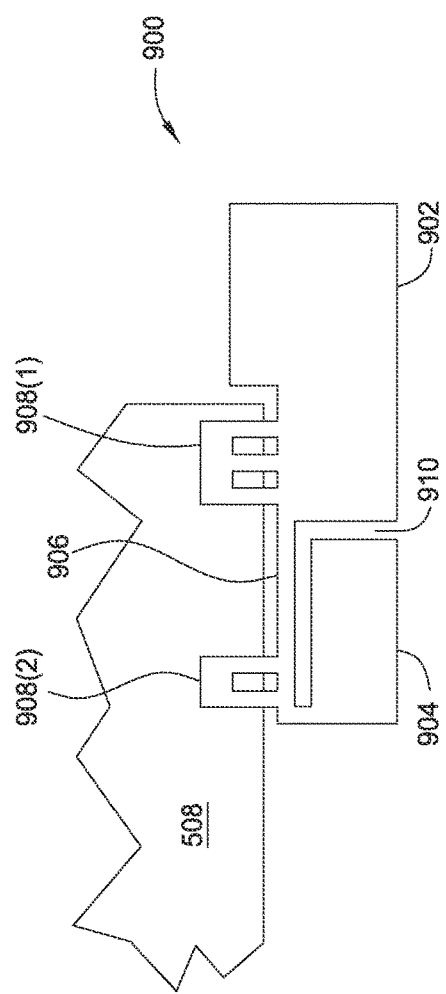
FIG. 9A is a diagram of a corner connector for providing power to a source driver, according to an example.

FIG. 9A is a diagram of a corner connector 900 for providing power to source driver 508, according to an example. In the particular example shown, the corner connector 900 is configured to provide power to both VCCD and VCCC/T while providing some noise filtering to VCCD. However, the corner connector 900 could be used, in other examples, to provide power to different power inputs for source driver 508.

Corner connector 900 includes a first portion 902 and a second portion 904 connected by a high resistance portion 906. The first portion 902 is coupled to a first pin 908(1) for VCCC/T and the second portion 904 is coupled to a second pin 908(2) for VCCD. The corner connector 900 includes stacked power supply and ground connectors to provide decoupling capacitance as described above with respect to FIGS. 8C and 8D.

The high resistance portion 906 is made to have high resistance by being significantly narrower than the first portion 902 or the second portion 904. To facilitate this geometry, an L-shaped gap 910 exists between first portion 902 and second portion 904.

First portion 902 is connected to first pin 908(1) via two power traces and a ground trace. Specifically, of the three-trace connection that is illustrated, two of the traces are coupled to the power plate of the parallel plate capacitor of the first portion 902 and one of the traces is coupled to the ground plate of the parallel plate capacitor of the first portion 902. Similar, second portion 904 is connected to second pin 908(2) via a power trace and a ground trace. The ground trace is coupled to the ground plate of the parallel plate capacitor of second portion 904 and the power trace is coupled to the power plate of the parallel plate capacitor of second portion 904. Note that although a certain number of traces are shown as providing power to source driver 508, other traces may be used consistently with this disclosure.

Figure 9B:
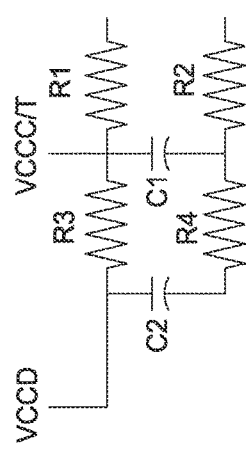
FIG. 9B is a circuit diagram representation of a corner connector, according to an example.

FIG. 9B is a circuit diagram representation 950 of corner connector 900, according to an example. Circuit diagram representation 950 is presented to illustrate how corner connector 900 provides filtering for VCCD. Referring to FIGS. 9A and 9B together, resistors R1 and R2 represent the resistance, for stacked power and ground, respectively, of first portion 902. Capacitance C1 represents the capacitance between the stacked power and ground of first portion 902. Resistors R3 and R4 represent resistance of high resistance portion 906, which is substantially greater than resistances R1 and R2. Capacitance C2 is the capacitance between the stacked power and ground of second portion 904. As can be seen, the point at the connection between R3 and C2 is coupled to VCCD.

This configuration filters noise for VCCD that might be induced by action of VCCC/T. More specifically, the capacitance included in second portion 904 provides buffered charge for use by VCCD. Further, high resistance portion 906 limits the amount of current that VCCC/T can draw from the capacitance included in second portion 904, "protecting" the stored charge to some degree. This has the effect of evening out the power supply received at VCCD.

Advantageously, features for a routing configuration between connectors and source drivers on a substrate such as glass are provided. The features include features for improve resistance of traces coupled to the source drivers as well as features for improving other characteristics of the source driver to connector routing. One feature includes a t-shaped connector which is shaped to help provide matched voltage to two adjacent source drivers. Another feature is the tapering of routing traces that provide power from a connector to source driver. Other features are also disclosed that improve various characteristics of the routing between connectors and source drivers. Any of the traces, including the t-shaped connector, can include stacked power supply and ground traces to provide decoupling capacitance.

Thus, the embodiments and examples set forth herein were presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

What is claimed is:

1. A display assembly, comprising:
    a plurality of display elements disposed on a substrate;
    a plurality of source driver lines disposed on the substrate and coupled to the plurality of display elements;
    a plurality of source drivers disposed on the substrate and coupled to the plurality of source driver lines, the plurality of source drivers configured to drive the plurality of source driver lines to drive the plurality of display elements for display updating;
    a plurality of flexible connectors extending out of the substrate and configured to communicatively couple the plurality of source drivers with a controller disposed external to the substrate, providing display signals and power supply signals from the controller to the plurality of source; and
    a first plurality of traces disposed on the substrate and coupling the plurality of flexible connectors with the plurality of source drivers, wherein each of the first plurality of traces couples a respective one of the plurality of flexible connectors with a respective one of the plurality of source drivers,
    wherein a ratio of a number of flexible connectors in the plurality of flexible connectors to a number of source drivers in the plurality of source drivers is two-to-three or three-to-four.

2. The display assembly of claim 1, wherein:
    the plurality of source drivers includes a source driver having a first set of input pins coupled to a first flexible connector of the plurality of flexible connectors and a second set of input pins coupled to a second flexible connector of the plurality of flexible connectors.

3. The display assembly of claim 1, wherein:
    at least one of the first plurality of traces is tapered.

4. The display assembly of claim 1, wherein the plurality of flexible connectors are flexible connector cables.

5. The display assembly of claim 1, wherein a first one of the first plurality of traces is coupled to a first side of a first source driver of the plurality of source drivers and a first one of the second plurality of traces is coupled to a second side of the first source driver.

6. The display assembly of claim 1 further comprising a t-shaped connector comprising a second plurality of traces disposed on the substrate and coupling a first flexible connector of the plurality of flexible connectors with a first source driver of the plurality of source drivers and a second source driver of the plurality of source drivers.

7. The display assembly of claim 6, wherein the t-shaped connector comprises:
    a narrow first portion coupled to the first connector; and
    a second portion coupled to the first source driver and the second source driver and having low resistance compared to the narrow first portion.

8. The display assembly of claim 7, further comprising:
    a first fanout extending from the first source driver and a second fanout extending from the second source driver,
    wherein the second portion of the t-shaped connector occupies space between the first fanout and the second fanout and has a shape complementary to the first fanout and the second fanout.

9. The display assembly of claim 6, wherein the second plurality of traces of the t-shaped connector comprises:
    a first power supply trace and a second power supply trace disposed in a stacked configuration.

10. The display assembly of claim 6, wherein:
    traces of the second plurality of traces is coupled to top edges of the first source driver and the second source driver.

11. A display assembly comprising:
    a plurality of display elements disposed on a substrate;
    a plurality of source driver lines disposed on the substrate and coupled to the plurality of display elements;
    a plurality of source drivers disposed on the substrate and coupled to the plurality of source driver lines, the plurality of source drivers configured to drive the plurality of source driver lines to drive the plurality of display elements for display elements;
    a plurality of flexible connectors extending out of the substrate and configured to communicatively couple the plurality of source drives with at least one controller disposed external to the substrate, wherein a ratio of a number of flexible connectors in the plurality of flexible connectors to a number of source drivers in the plurality of source drivers is two-to-three or three-to-four; and a plurality of traces disposed on the substrate and coupling the plurality of flexible connectors with the plurality of source drivers, wherein each of the plurality of traces couples a respective one of the plurality of flexible connectors with a respective one of the plurality of source drivers, wherein a first flexible connector of the plurality of flexible connectors is configured to provide power supply signals and display signals to a first source driver of the plurality of source drivers via a first group of the plurality of traces and a second source driver of the plurality of source drivers via a second group of the plurality of traces, and a second flexible connector of the plurality of flexible connectors configured to provide power supply signals and display signals to the second source driver via a third group of the plurality of traces and a third source driver of the plurality of source drivers via a fourth group of the plurality of traces, wherein the second flexible connector is not configured to provide power supply signals and display signals to the first source driver.

12. The display assembly of claim 11, wherein:
the plurality of source drivers include a source driver having a first set of input pins coupled to the first flexible connector via the first group of the plurality of traces and a second set of input pins coupled to the second flexible connector via the second group of the plurality of traces, wherein each of the first group of the plurality of traces is coupled to a different one of the first set of input pins and each of the second group of the plurality traces is coupled to a different one of the second set of input pins.

13. The display assembly of claim 11, further comprising:
a t-shaped connector comprising traces disposed on the substrate and coupled to the first connector and to the first source driver and the second source driver.

14. The display assembly of claim 13, wherein the t-shaped connector comprises:
a narrow first portion coupled to the first connector; and
a second portion coupled to the first source driver and the second source driver and having low resistance compared to the narrow first portion.

15. The display assembly of claim 14, further comprising:
a first fanout extending from the first source driver and a second fanout extending from the second source driver, wherein the second portion of the t-shaped connector occupies space between the first fanout and the second fanout and has a shape complementary to the first fanout and the second fanout.

16. The display assembly of claim 13, wherein the traces of the t-shaped connector comprise:
a first power supply trace and a second power supply trace disposed in a stacked configuration.

17. The display assembly of claim 13, wherein:
the t-shaped connector is configured to provide one or more of the power supply signals to the first source driver and the second source driver.

18. The display assembly of claim 13, wherein:
the t-shaped connector is coupled to top edges of the first source driver and the second source driver via the traces of the t-shaped connector.

19. The display assembly of claim 11, wherein:
wherein at least one of the plurality of traces coupling the plurality of flexible connectors to the plurality of source drivers are tapered.

20. An input device, comprising:
a plurality of sensor electrodes;
a plurality of display elements disposed on a substrate;
a plurality of source driver lines disposed on the substrate and coupled to the plurality of display elements;
a plurality of source drivers disposed on the substrate, the plurality of source drivers coupled to the plurality of source driver lines and to the plurality of sensor electrodes, the plurality of source drivers configured to drive the plurality of source driver lines to drive the plurality of display elements for display updating and to drive the plurality of sensor electrodes for capacitive sensing; and
a plurality of flexible connectors extending out of the substrate and configured to communicatively couple the plurality of source drivers with at least one controller disposed external to the substrate, providing display signals, sensing signals, and power supply signals from the at least one controller to the plurality of source drivers; and
a first plurality of traces disposed on the substrate and coupling the plurality of flexible connectors with the plurality of source drivers, wherein each of the first plurality of traces couples a respective one of the plurality of flexible connectors with a respective one of the plurality of source drivers,
wherein a ratio of a number of flexible connectors in the plurality of flexible connectors to a number of source drivers in the plurality of source drivers is two to three or three-to-four.

* * * * *